United States Patent
Cioffi et al.

(10) Patent No.: US 7,449,968 B1
(45) Date of Patent: Nov. 11, 2008

(54) FREQUENCY AND TEMPERATURE COMPENSATION SYNTHESIS FOR A MEMS RESONATOR

(75) Inventors: Kenneth R. Cioffi, San Jose, CA (US); Didier Lacroix, Los Gatos, CA (US)

(73) Assignee: Discera, Inc., San Jose, CA (US)

( * ) Notice: Subject to any disclaimer, the term of this patent is extended or adjusted under 35 U.S.C. 154(b) by 77 days.

(21) Appl. No.: 11/417,739

(22) Filed: May 3, 2006

Related U.S. Application Data

(60) Provisional application No. 60/677,288, filed on May 3, 2005.

(51) Int. Cl.
*H03B 5/30* (2006.01)
(52) U.S. Cl. .................. 331/154; 331/16; 331/175; 331/176
(58) Field of Classification Search .......... 331/154, 331/176, 16, 175
See application file for complete search history.

(56) References Cited

U.S. PATENT DOCUMENTS

| | | | |
|---|---|---|---|
| 4,454,483 A | 6/1984 | Baylor | 331/11 |
| 4,712,078 A | 12/1987 | Slobodnik, Jr. et al. | 331/99 |
| 6,249,155 B1 | 6/2001 | Hartman et al. | 327/106 |
| 6,930,569 B2 | 8/2005 | Hsu | 333/186 |
| 6,995,622 B2 * | 2/2006 | Partridge et al. | 331/66 |
| 7,042,301 B2 * | 5/2006 | Sutardja | 331/176 |
| 7,145,402 B2 | 12/2006 | Mattila et al. | |
| 2005/0184822 A1 | 8/2005 | Mattila et al. | |

FOREIGN PATENT DOCUMENTS

WO WO 2006/000611 1/2006

OTHER PUBLICATIONS

Skyworks Solutions, Inc., "Application Note: Fine Frequency Control Using the SKY72300, SKY72301, and SKY72303 Dual Synthesizers/PLLs," pp. 1-6 (Sep. 2005).
Wang et al., "VHF Free-Free Beam High-Q Micromechanical Resonators," *Technical Digest*, 12th Int'l IEEE Micro Electro Mechanical Systems Conf., pp. 453-458 (1999).

* cited by examiner

*Primary Examiner*—Arnold Kinkead
(74) *Attorney, Agent, or Firm*—Lempia Braidwood LLC

(57) ABSTRACT

Disclosed herein is a signal generation technique based on a reference frequency provided by a MEMS resonator. The signal generation technique compensates for temperature- and fabrication process-induced frequency variations collectively. In some embodiments, a device implementing the disclosed signal generation technique includes a fractional-N synthesizer, a temperature sensor, calibration data, and a sigma-delta modulator to adjust the reference frequency of the MEMS resonator to a desired frequency value while compensating for the temperature variation of the MEMS resonator.

20 Claims, 3 Drawing Sheets

FREQUENCY AND TEMPERATURE COMPENSATION SYNTHESIS FOR A MEMS RESONATOR

CROSS-REFERENCES TO RELATED APPLICATIONS

This application claims the benefit of U.S. provisional application Ser. No. 60/677,288, filed May 3, 2005, and entitled "Frequency and Temperature Compensated MEMS Resonator," the entire disclosure of which is hereby expressly incorporated by reference.

STATEMENT REGARDING FEDERALLY SPONSORED RESEARCH OR DEVELOPMENT

This invention was made with government support under Contract No.: 70NANB4H3001 awarded by the National Institute for Standards and Technology (NIST). The government has certain rights in the invention.

This application relates to commonly assigned and concurrently filed U.S. non-provisional application entitled "MEMS Resonator-Based Signal Modulation" Ser. No 11/417,833, the entire disclosure of which is hereby expressly incorporated by reference.

BACKGROUND OF THE DISCLOSURE

1. Field of the Disclosure

The disclosure relates generally to frequency synthesis devices and, more particularly, to frequency synthesis using MEMS (microelectromechanical systems) resonators, or microresonators, for reference signal generation.

2. Brief Description of Related Technology

MEMS resonators are attractive for use in many applications as a cost-effective replacement for discrete devices such as quartz crystal oscillators or surface-acoustic wave (SAW) resonators. MEMS resonators are particularly promising for use in wireless communications systems, as they can be fabricated alone or on substrates with other circuitry, such as MOS or bipolar circuits. MEMS resonators can also have very high mechanical quality factors (Q), which leads to good frequency selectivity. MEMS resonators also typically consume less power than their discrete counterparts.

MEMS resonators are not without drawbacks, however. The center frequency of a MEMS resonator is determined by its physical characteristics, which are, in turn, functions of design, materials, and the processing methods used to fabricate the resonator. Due to its high-Q nature and the normal process variations that occur in fabrication, it is difficult to fabricate a MEMS resonator with a center frequency accuracy of better than a few percent.

Many applications for which MEMS resonators are well suited demand initial accuracy of between 1 and 100 parts-per-million (ppm), which is 3 to 5 orders of magnitude more precise than typical accuracy. In order to reach the requisite level of accuracy, laser trimming or other methods have been used. Trimming methods have generally been found to undesirably add to the complexity and cost of the fabrication process. Thus, despite the number of different trimming methods available, it would nonetheless be desirable to develop an alternative for achieving the necessary 1 to 100 ppm center-frequency accuracy that does not involve trimming and other complex fabrication steps.

In addition to initial frequency inaccuracy, the resonant frequency of a MEMS resonator is dependent on temperature. The temperature dependency of the resonant frequency can be as much as 17 ppm/° C. Unfortunately, the maximum allowable temperature variation is 0.02 to 1 ppm/° C. (a difference of 4 orders of magnitude) for many applications. Several methods for achieving temperature compensated MEMS resonator structures have been proposed, but these proposals have all required additional processing steps during resonator fabrication. The cost and complexity added by these processing steps make these approaches unattractive.

A method of adjusting the initial frequency of a MEMS resonator and compensating for temperature-change-induced frequency variation without the need for extra manufacturing steps during fabrication would be desirable. Such a method would reduce the cost and manufacturing complexity associated with producing a MEMS resonator product.

SUMMARY OF THE DISCLOSURE

Disclosed herein is an apparatus that generates a signal based on the frequency developed by a MEMS resonator and compensates for any temperature-induced frequency variation without some of the costs and disadvantages in the prior art. In some embodiments, the apparatus includes a MEMS resonator and synthesizer circuitry. The synthesizer circuitry is responsive to a temperature sensor and calibration data to develop an output signal having a desired frequency. To that end, the apparatus may include a fractional-N synthesizer and a sigma-delta modulator to compensate for the temperature variation of the MEMS resonator.

BRIEF DESCRIPTION OF THE DRAWING FIGURES

For a more complete understanding of the disclosure, reference should be made to the following detailed description and accompanying drawing figures, in which like reference numerals identify like elements in the figures, and in which.

Figure 1:
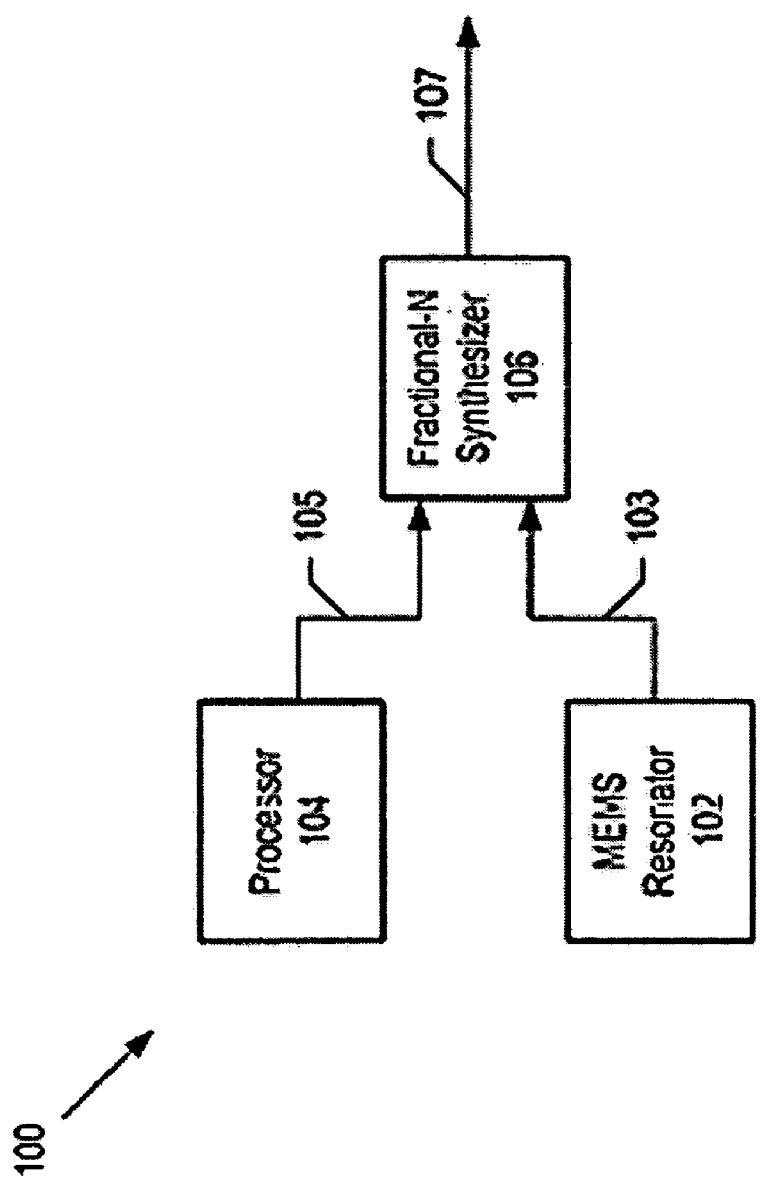
FIG. 1 is a block diagram of a MEMS-based signal generation device in accordance with one aspect of the disclosure.

While the disclosed devices and methods are susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

DETAILED DESCRIPTION OF PREFERRED EMBODIMENTS

The invention generally relates to a frequency compensation technique for MEMS resonators that addresses multiple contributions to frequency variance from a variety of sources, including temperature-induced frequency changes and fabrication process-based frequency offsets. The disclosed technique includes and involves the generation of a composite compensation factor that accumulates or combines the multiple frequency variance contributions to control the synthesis of an output signal having a compensated frequency. In this way, any offsets or variances in the reference frequency developed by the MEMS resonator are addressed collectively.

Generally speaking, the composite compensation factor achieves frequency compensation via adjustment (or re-calculation) of the frequency division factors for the frequency synthesis in accordance therewith.

FIG. 1 depicts an exemplary signal generation device indicated generally at 100 configured to implement the disclosed frequency and temperature compensation technique in accordance with one embodiment. The device 100 generates a frequency compensated output signal from a reference signal provided by a MEMS resonator 102 via an input port or line 103. The frequency of the reference signal is adjusted in accordance with a control signal provided by a processor 104 via an input port or line 105. The output signal is generated by synthesizer circuitry 106 from the reference signal in accordance with the control signal. In some cases, the circuitry 106 may implement fractional-N synthesis, as shown in the exemplary embodiment of FIG. 1 and described below. More generally, the synthesizer circuitry 106 implements any desired frequency multiplication scheme to arrive at the frequency of the output signal. To that end, the circuitry 106 may include a frequency multiplier (and frequency divider) to generate the output signal on an output line 107 based on the reference frequency of the MEMS resonator 102 and the control signal from the processor 104.

The signal generation device 100 is programmable in the sense that the control signal may include and provide a digital representation of a desired frequency for the output signal. The synthesizer circuitry 106 is responsive to the digital representation to adjust the frequency of the output signal accordingly. For example, the MEMS resonator 102 may provide a frequency of 80 MHz to the synthesizer circuitry 106. The output signal generated via the synthesizer circuitry 106 may have an output frequency of 250 MHz. In some embodiments, the synthesizer circuitry 106 includes a fractional-N synthesizer to tune the initial frequency and compensate for frequency variations due to temperature changes of MEMS resonator 102 in a rapid manner. Alternatively, an integer synthesizer may be used. The trimming accuracy of an integer-N synthesizer is determined by a comparison source frequency. For example, in order to achieve a 10 ppm trimming accuracy (as required in many applications) for an output frequency of 250 MHz, an integer-N synthesizer would require a comparison frequency of 2.5 KHz. As a result, associated lock-time for the synthesizer can become prohibitive. The trimming accuracy of a fractional-N synthesizer, on the other hand, can be very small—even when maintaining a high comparison frequency and a wide loop bandwidth; therefore, lock time is reduced.

In the foregoing example, the ratio of the output frequency to the comparison frequency is $10^5$, which adds 90 dB to a phase detector noise floor typically around −150 dBc/Hz, resulting in a loop phase noise of −50 dBc/Hz. In the case of the device 100, the achievable in-loop phase noise is that of the reference plus the ratio of the output frequency to the reference frequency, or approximately 10 dB. MEMS resonator 102 has a 1 KHz phase noise of −115 dBc/Hz, which results in an in-loop phase noise of −105 dBc/Hz. It will be clear to those skilled in the art that the phase noise characteristics of the MEMS resonator 102 and the synthesizer circuitry 106 are merely exemplary, and that other phase-noise characteristics are possible without departing from the scope of the present invention.

Figure 2:
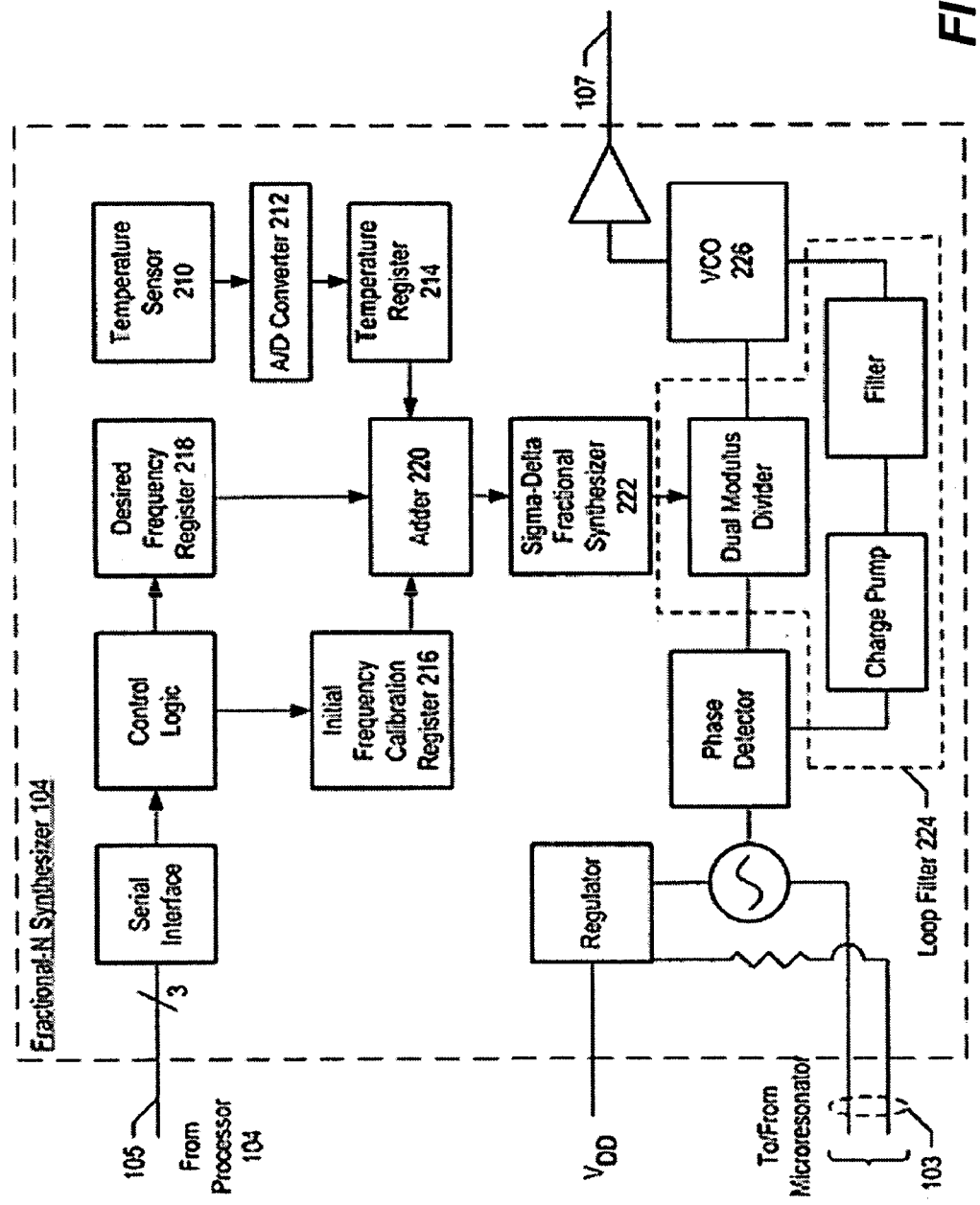
FIG. 2 is a block diagram of a frequency synthesizer circuit of the signal generation device of FIG. 1 in accordance with an exemplary embodiment; and, FIG. 3 is a block diagram of a frequency synthesizer circuit of the signal generation device of FIG. 1 in accordance with another exemplary embodiment.

FIG. 2 depicts the synthesizer circuitry 106 in greater detail and in accordance with an exemplary embodiment. The synthesizer circuitry 106 may be implemented via one or more integrated circuits, such as, for example, a single application-specific integrated circuit, or ASIC. The synthesizer circuitry 106 includes a temperature sensor 210 to monitor the temperature at which the MEMS resonator 102 operates. The MEMS resonator 102 is characteristic of most MEMS resonators, in that it has a linear temperature characteristic over a very wide temperature range. Therefore, a piecewise linear temperature characteristic may be used for calibration purposes, as described below. An A/D converter 212 converts the output of the temperature sensor 210 to digital information, which is then relayed to a temperature register 214. The initial frequency (i.e., the resonant frequency of as-fabricated MEMS resonator 102) is calibrated at manufacturing and the value is stored in initial frequency calibration register 216 (hereinafter, ROM 216). The value stored in the ROM 216 and the value stored in the temperature register 214 are added to the value stored in a desired frequency register 218 by an adder 220 and relayed to a sigma-delta fractional synthesizer 222. Although the embodiment presented utilizes a sigma-delta fractional synthesizer, it will be clear to those skilled in the art, after reading this specification, how to make and use alternative embodiments of the present invention that utilize any type of synthesizer.

The output of the sigma-delta fractional synthesizer 222 is relayed to a loop filter 224, which then provides an input to a VCO 226. The output of the VCO 226 provides the output signal on the line 107 (FIG. 1) of the signal generation device 100.

Although the embodiment described above utilizes a fractional-N synthesizer comprising a sigma-delta modulator, other types of synthesizers, such as integer synthesizers, may be used alternatively or additionally.

Figure 3:
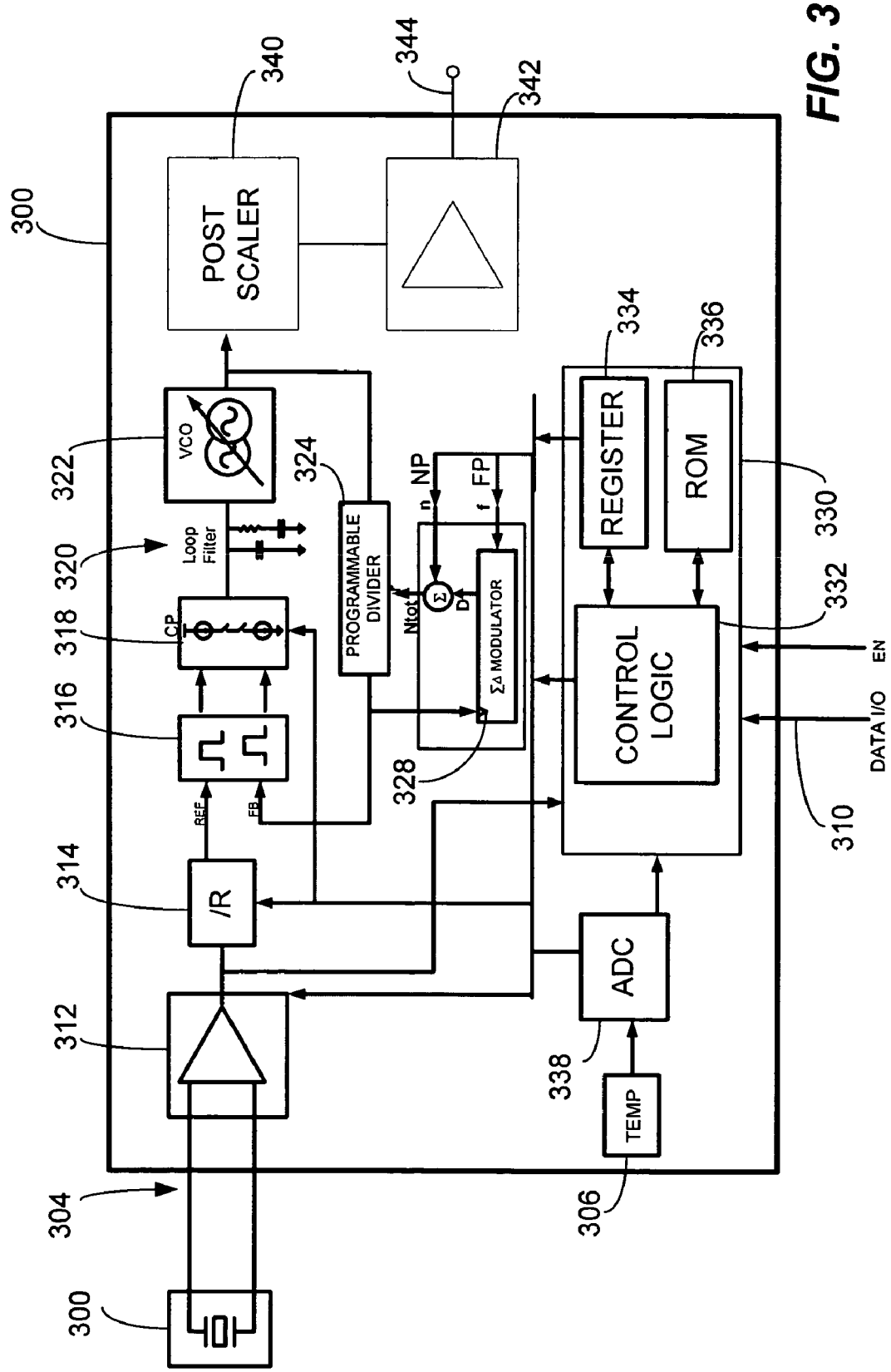

FIG. 3 depicts an alternative embodiment in which the respective contributions to the frequency variance or offset are compiled and addressed collectively via a composite frequency compensation parameter. The composite parameter is generally determined from data derived from the frequency of the MEMS resonator reference signal, the operating temperature for the MEMS resonator, and the desired output signal frequency.

In the exemplary embodiment shown in FIG. 3, a signal generation device 300 receives a resonator signal from a MEMS resonator 302 via an input port 304. An indication of the operating temperature for the MEMS resonator 302 is provided by a temperature sensor 306, which may be integrated with the rest of the circuitry of the signal generation device 300 as an on-chip sensor, or received via an input port if disposed externally. An indication of a desired output frequency is provided via an input port 310. In this way, the device 300 may be programmed by an external source that develops a control signal for the desired frequency. The external source may also provide an activation signal to enable operation of the device 300.

The device 300 includes an oscillator circuit 312 to amplify, condition and facilitate oscillation of the resonator signal, which is then passed to a regulator 314 prior to processing by a phase-lock loop circuit. The phase-lock loop circuit includes a phase and frequency detector 316, a charge pump 318, a loop filter indicated generally at 320, and a VCO 322. The phase-lock the circuit further includes a programmable divider 324 responsive to, or controlled by, a division factor generated by a fractional-n synthesizer 326 having a sigma-delta modulator 328.

In operation, the programmable divider 324 supports the frequency multiplication provided by the phase-lock loop circuit involved in generating the desired output frequency from the resonator signal. Furthermore, the programmable divider 324 and the fractional-n synthesizer 326 implement frequency compensation for the MEMS resonator 302 based on input parameters provided by a controller or control system 330. Generally speaking, the controller 330 compiles the effects of both the operating temperature and process fabrication to generate a synthesizer control signal provided to the fractional-n synthesizer 326. The control signal may include one or more synthesizer input parameters, such as the division factors N and F. Modified versions of these division factors are derived from a composite frequency compensation parameter calculated by a control logic 332 implemented by the controller 330. The control logic 332 may be responsive to data stored in one or more registers 334 and other memories, such as a ROM or PROM 336. Generally speaking, the data stored in the memories 334, 336 may be indicative of calibration data associated with the MEMS resonator 302. For example, an initial output frequency for the MEMS resonator 302 may be stored, as well as a temperature characteristic.

The controller 330 may receive data indicative of the operating temperature from an analog to digital converter (ADC) 338 in communication with the temperature sensor 306. The ADC 338 may have high resolution and accuracy to accommodate temperature sensing as accurate as 0.1 C over a temperature range of, for instance, −50 C to 150 C. Dividing that temperature range at that resolution results in an 11 bit ADC for the temperature sensor 306.

Despite the high resolution and accuracy of the temperature indication, the temperature characteristic utilized by the control logic 332 need not be based on many actual data points for the MEMS resonator 302. Rather, in some embodiments, the temperature characteristic may be derived from as few as three data points. From those points, a piecewise linear characteristic may be generated as described below.

The temperature characteristic is one of many components to the determination of the composite frequency compensation parameter. Further details regarding the determination are provided below. Generally speaking, however, the composite frequency compensation parameter is used to control the fractional-n synthesizer 326 and thereby control the frequency multiplication implemented by the device 300 such that after processing by a post scaler 340 and an output driver 342, an output signal is developed or generated on an output line 344.

Temperature and Process Compensation.

The control logic shown in FIG. 3 may implement the exemplary temperature compensation algorithm described below. The objective of the algorithm is to modify the synthesizer division factor to correct for resonator frequency shifts due to both fabrication process and temperature. This collective approach to frequency synthesis may be achieved by calibrating the resonator and synthesizer together at several temperatures to determine a linear (or piecewise linear) characteristic of the resonator frequency as a function of the temperature.

Because the resonator may have a process spread in its resonance frequency of ±5% in addition to a temperature coefficient of TC~−20 ppm/C, the output frequency may vary significantly. The output frequency $f_{out}$ (FIG. 3) is determined by the resonator frequency $f_{Xtal}$ and the PLL division factors N, F, R and M through the following equation:

$$fout = \frac{fXtal \cdot (N + F/2^f)}{R \cdot M}$$

As shown below, one way to address and compensate for any error in the output frequency due to a change in fXtal is by modifying the factors N and F (i.e., to NP and FP) such that the error between the actual output frequency and the required frequency is better than a desired threshold, such as ±10 ppm:

$$fout_{Error\_ppm} = \frac{fout_{act} - fout_{req}}{fout_{req}} \leq \pm 10 ppm$$

In accordance with one embodiment, the modified factors NP and FP may be determined using the following algorithm based on a composite compensation parameter, K_PT that combines the effects of both process variation and temperature-induced variation:

$$NP + \frac{FP}{2^f} = \left(N + \frac{F}{2^f}\right) \cdot (1 - K\_PT)$$

$$K\_PT = \frac{\Delta fXtal_{proc} + \Delta fXtal_T \cdot (T - T_{nom})}{fXtal_{0\_nom} + \Delta fXtal_{proc} + \Delta fXtal_T \cdot (T - T_{nom})}$$

$$\Delta fXtal_{proc} = fXtal_{nom} - fXtal_{0\_nom}$$

$$\Delta fXtal_T = Xftal_{nom} \cdot TC$$

As shown in FIG. 3, a temperature measurement may be provided via a temperature sensor or system including, for instance, a PTAT temperature sensor and an 11-bit A/D converter used to provide a digital representation of the temperature of the resonator. In some embodiments, the algorithm determines K_PT using a two-segment piecewise linear approximation. The 11-bit reading of the A/D converter (adc) will be used to calculate K_PT, which, in turn, is used to calculate NP and FP. The Sigma-Delta Modulator is then given NP and FP as its inputs rather than the inputs originally stored in the Register File N and F.

An exemplary temperature compensation algorithm is based on a three-point calibration technique that uses a two segment approximation of K_PT as a function of adc. The following procedure may be utilized to calibrate the system:

1. Power-Up Chip and load defaults.
2. Load calibration division factor (N=32, F=0, M=24, R=2), turn OFF Temp. Comp Algorithm. Required frequency is fXtal0_nom=19.0 MHz
3. Change chip temperature to target
4. Measure o/p frequency and compare with required frequency
5. Calculate (OFF chip) required N' and F' to correct frequency using:

$$Ntot = N' + \frac{F'}{2^{16}} = \frac{32 \cdot fXtal_{0\_nom}}{fout_{meas}}$$

$$N' = \text{fix}(Ntot)$$

$$F' = \text{round}((N' - Ntot) \cdot 2^{16})$$

6. Load calculated N' and F' to registers of N and F
7. Measure o/p frequency and compare with required frequency, if error >0.5 ppm repeat procedures (5) & (6).
8. Calculate K_PT (OFF chip) using:

$$K\_PT = \frac{(N' - 32) + F'/2^{16}}{32}$$

9. Load K_PT and store in SRAM (SRAM is not Register File rather memory available in PPROM).

10. Write A/D o/p (adc) to OUTP port and check if in range

11. Store ADC output in SRAM

12. Keep supply ON and change temperature, procedure (3). Repeat to cover 3 points.

13. Calculate slopes m1 and m2 externally using stored (adc, K_PT) stored points in SRAM:

$$m1 = \frac{K\_PT(1) - K\_PT(2)}{adc(1) - adc(2)}$$

$$m2 = \frac{K\_PT(3) - K\_PT(2)}{adc(3) - adc(2)}$$

14. Load m1, m2 and reference point (point 2) to Register Map

15. Enable Temperature Compensation and measure output frequency to check for ppm error <10 ppm 16. Fuse PPROM The required error may be achieved using a 16-bit sigma-delta modulator and an 11-bit ADC, although other sizes may also be sufficient. The calculations may be performed internally digitally using memories capable of handling the following representations for the parameters K_PT, adc and m:

N: 6 bits
F: 16 bits
adc: 11 bits
K_PT: 20 bits 2's complement format after scaling by 219
m1, m2: 8 bits after scaling by 228 and taking absolute value In some applications, the output signal may be indicative of analog information or digital data via frequency modulation or frequency-shift keying encoding, as described in the above-referenced, concurrently filed patent application. In such cases, the above-described compensation technique may be useful to ensure that temperature and other effects do not distort the transmission of data or information via frequency drift. Generally speaking, the reference frequency developed by the MEMS resonator may reflect the information or data to be transmitted. A description of the manner in which the reference frequency (i.e., the resonant frequency of the MEMS resonator) may be modulated is set forth in the above-referenced patent application.

Embodiments of the disclosed system and method may be implemented in hardware, software, firmware or any combination thereof. Some embodiments may be implemented with computer programs executing on programmable systems having at least one processor, a data storage system (including volatile and non-volatile memory and/or storage elements), at least one input device, and at least one output device. The programs may be implemented in a high level procedural or object oriented programming language to communicate with a processing system. The programs may also be implemented in assembly or machine language, if desired. In fact, practice of the disclosed system and method is not limited to any particular programming language. In any case, the language may be a compiled or interpreted language.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. A device for generation of an output signal having a desired frequency, the device comprising:
   a MEMS resonator to generate a reference signal;
   a frequency synthesizer to develop the output signal from the reference signal;
   a temperature sensor to generate an analog indication of an operating temperature for the MEMS resonator;
   an analog-to-digital converter to develop a digital representation of the operating temperature from the analog indication thereof, the digital representation having a resolution of at least 11 bits; and,
   a controller to compile frequency compensation contributions from the digital representation of the operating temperature and a digital indication of the desired frequency to generate a synthesizer control signal provided to the frequency synthesizer.

2. The device of claim 1, wherein the controller determines the frequency compensation contribution from the digital representation of the operating temperature based on a linear temperature characteristic for the MEMS resonator.

3. The device of claim 1, wherein the controller is calibrated to generate the synthesizer control signal from a composite compensation factor based on a linear function of the digital representation of the operating temperature.

4. The device of claim 3, wherein the linear function comprises a pair of linear segments about a reference point.

5. The device of claim 4, wherein the controller is calibrated with data indicative of respective slopes of the pair of linear segments.

6. The device of claim 3, wherein the linear function is a piecewise linear approximation.

7. The device of claim 3, wherein the analog-to-digital converter is configured to develop the digital representation of the operating temperature within an accuracy of 0.1 C.

8. The device of claim 3, wherein the synthesizer control signal comprises phase-locked loop (PLL) division factors for the frequency synthesizer.

9. The device of claim 3, wherein the linear function is further based on an initial frequency offset of the MEMS resonator from the desired frequency.

10. The device of claim 9, wherein the controller comprises a memory in which data indicative of the linear function is stored, the data comprising multiple slope parameters and a reference point.

11. A method of frequency compensation for a desired output frequency in connection with a MEMS resonator, the method comprising the steps of:
    receiving a resonator signal from the MEMS resonator;
    providing a temperature signal indicative of an operating temperature for the MEMS resonator;
    determining a composite frequency compensation parameter in accordance with multiple slope quantities for a piecewise linear approximation based on the temperature signal and the desired output frequency; and, generating an output signal having the desired output frequency using a frequency synthesizer based on the composite frequency compensation parameter;

wherein the providing step comprises the step of converting the temperature signal from an analog representation of the operating temperature into a digital representation of the operating temperature; and wherein the converting step is performed such that the digital representation of the operating temperature is within an accuracy of 0.1 C.

12. The method of claim 11, wherein the piecewise linear approximation is a function of the operating temperature.

13. The method of claim 12, wherein the generating step comprises the step of developing a synthesizer control signal from the composite frequency compensation parameter.

14. The method of claim 13, wherein the synthesizer control signal comprises data indicative of phase-locked loop (PLL) division factors.

15. The method of claim 12, wherein the piecewise linear approximation is further based on an initial frequency offset of the MEMS resonator from the desired output frequency.

16. A device to generate an output signal having a desired frequency in connection with a MEMS resonator, the device comprising:

an analog-to-digital converter to develop a digital representation of an operating temperature for the MEMS resonator;

a controller to generate a control signal based on the digital representation of the operating temperature, the controller comprising a memory and control logic, wherein the memory stores data comprising multiple slope quantities for a piecewise linear approximation of a composite frequency compensation factor, and wherein the control logic is configured to determine the composite frequency compensation factor based on the piecewise linear approximation and the digital representation of the operating temperature; and, a phase-locked loop (PLL) circuit comprising a divider configured to be responsive to the control signal to synthesize the desired frequency;

wherein the analog-to-digital converter is configured to develop the digital representation of the operating temperature within an accuracy of 0.1 C.

17. The device of claim 16, wherein the piecewise linear approximation is further based on an initial frequency offset of the MEMS resonator from the desired frequency.

18. A device to generate an output signal having a desired frequency in connection with a MEMS resonator, the device comprising:

an analog-to-digital converter to develop a digital representation of an operating temperature for the MEMS resonator;

a controller to generate a control signal based on the digital representation of the operating temperature the controller comprising a memory and control logic, wherein the memory stores data comprising multiple slope quantities for a piecewise linear approximation of a composite frequency compensation factor, and wherein the control logic is configured to determine the composite frequency compensation factor based on the piecewise linear approximation and the digital representation of the operating temperature; and, a phase-locked loop (PLL) circuit comprising a divider configured to be responsive to the control signal to synthesize the desired frequency;

wherein the analog-to-digital converter is configured such that the digital representation has a resolution of at least 11 bits.

19. A method of frequency compensation for a desired output frequency in connection with a MEMS resonator, the method comprising the steps of:

receiving a resonator signal from the MEMS resonator;

providing an analog temperature signal indicative of an operating temperature for the MEMS resonator;

converting the analog temperature signal into a digital representation of the operating temperature having a resolution of at least 11 bits;

determining a composite frequency compensation parameter in accordance with the digital representation of the operating temperature and the desired output frequency; and, generating an output signal having the desired output frequency using a frequency synthesizer based on the composite frequency compensation parameter.

20. The method of claim 19, wherein the determining step comprises calculating the composite frequency compensation parameter based on a piecewise linear function of the digital representation of the operating temperature.

* * * * *